US012624805B2

(12) United States Patent
Park

(10) Patent No.: US 12,624,805 B2
(45) Date of Patent: May 12, 2026

(54) LED BULBS INCORPORATING NEGATIVE POISSON'S RATIO STRUCTURES

(71) Applicant: Joon Bu Park, Las Vegas, NV (US)

(72) Inventor: Joon Bu Park, Las Vegas, NV (US)

( * ) Notice: Subject to any disclaimer, the term of this patent is extended or adjusted under 35 U.S.C. 154(b) by 0 days.

(21) Appl. No.: 18/927,214

(22) Filed: Oct. 25, 2024

(65) Prior Publication Data

US 2026/0117939 A1    Apr. 30, 2026

(51) Int. Cl.
| | |
|---|---|
| *F21K 9/238* | (2016.01) |
| *F21V 29/70* | (2015.01) |
| *F21Y 113/00* | (2016.01) |
| *F21Y 115/10* | (2016.01) |
| *H10H 20/01* | (2025.01) |
| *H10H 29/01* | (2025.01) |

(52) U.S. Cl.
CPC .............. *F21K 9/238* (2016.08); *F21V 29/70* (2015.01); *H10H 20/0362* (2025.01); *H10H 29/0362* (2025.01); *F21Y 2113/00* (2013.01); *F21Y 2115/10* (2016.08)

(58) Field of Classification Search
CPC ............. H10H 20/854; H10H 20/0362; H10H 29/0362; F21Y 2115/10; B29C 44/357; F21K 9/23; F21K 9/232; F21V 5/007; H01L 23/28; H01L 23/293; H01L 23/295; H01L 23/296; H01L 23/298; H01L 23/239; H01L 23/291; F21S 4/22; F21S 4/24; F21S 4/26
See application file for complete search history.

(56) References Cited

U.S. PATENT DOCUMENTS

| | | | | |
|---|---|---|---|---|
| 2007/0045823 A1* | 3/2007 | Miller | ................... | H01L 23/295 |
| | | | | 257/706 |
| 2010/0165600 A1* | 7/2010 | Ku | ......................... | H01L 24/48 |
| | | | | 362/249.02 |

(Continued)

FOREIGN PATENT DOCUMENTS

| | | | | |
|---|---|---|---|---|
| CN | 115719785 A | * | 2/2023 | |
| DE | 3222791 A | * | 12/1983 | |

(Continued)

OTHER PUBLICATIONS

Körner et al., "A systematic approach to identify cellular auxetic materials," Smart Materials and Structures, Dec. 19, 2014, 24(2): 1-10.

*Primary Examiner* — Erin Kryukova
(74) *Attorney, Agent, or Firm* — Fish & Richardson P.C.

(57) ABSTRACT

An LED bulb includes a bulb body, with a first set of components composed of an NPR material, and a second set of components composed of a PPR material. The first set of components include thermal encapsulants, thermal pottants, a heat sink, thermal interface materials, and LED chip encapsulants. The second set of components include a socket, a base, an LED driver, conformal coating, adhesives, reflector materials, an LED module, LEDs, primary optics, and secondary optics. The incorporation of NPR materials into LED bulb components can provide various advantages over LED bulbs that include only positive Poisson's ratio (PPR) materials. For example, NPR materials can facilitate improved heat dissipation from, and/or cooling of, integrated components of LED bulbs, among other benefits.

6 Claims, 9 Drawing Sheets

(56)                    References Cited

U.S. PATENT DOCUMENTS

| 2012/0020092 | A1 | * | 1/2012 | Bailey | F21K 9/61 |
| | | | | | 313/483 |
| 2015/0108510 | A1 | * | 4/2015 | Urano | H10H 20/8515 |
| | | | | | 257/88 |
| 2021/0131643 | A1 | * | 5/2021 | Van Bommel | F21V 7/0091 |
| 2021/0320269 | A1 | * | 10/2021 | Yu | H10K 59/90 |
| 2024/0206086 | A1 | * | 6/2024 | Kim | H05K 5/02 |
| 2024/0363458 | A1 | | 10/2024 | Park | |

FOREIGN PATENT DOCUMENTS

| EP | 3987181 | A1 | | 4/2022 | |
| KR | 20220087112 | A | * | 6/2022 | H01L 51/5253 |
| MY | PI2017700243 | A0 | | 1/2016 | |
| MY | 180989 | A | | 12/2020 | |
| WO | WO 2020162864 | A1 | | 8/2020 | |
| WO | WO 2020257664 | A1 | | 12/2020 | |

* cited by examiner

LED BULBS INCORPORATING NEGATIVE POISSON'S RATIO STRUCTURES

BACKGROUND

The present disclosure relates generally to LED bulbs that incorporate structures having negative Poisson's ratios.

LED bulbs are often used as a light source over existing alternatives, such as fluorescent and incandescent bulbs. While LED bulbs are more efficient in light production than other bulb types, they still suffer from energy losses. LED bulbs have various components that perform heat management functions. For example, LED bulbs can include heat sinks, thermal transfer pads, or various encapsulants to effectively transfer heat or protect circuit elements. As LED color can affect heat emission and the number of color options in LED bulbs has increased, heat dissipation has emerged as a notable aspect of LED bulb design.

SUMMARY

We describe here LED bulbs that feature negative Poisson's ratio ("NPR") materials. An NPR material is a material that has a Poisson's ratio that is less than zero, such that when the material experiences a positive strain along one axis (e.g., when the material is stretched), the strain in the material along the two perpendicular axes is also positive (e.g., the material expands in cross-section). Conversely, when the material experiences a negative strain along one axis (e.g., when the material is compressed), the strain in the material along a perpendicular axis is also negative (e.g., the material compresses along the perpendicular axis). By contrast, a material with a positive Poisson's ratio ("PPR") has a Poisson's ratio that is greater than zero. When a PPR material experiences a positive strain along one axis (e.g., when the material is stretched), the strain in the material along the two perpendicular axes is negative (e.g., the material compresses in cross-section), and vice versa.

The incorporation of NPR materials into LED bulb components can provide various advantages over LED bulbs that include only positive Poisson's ratio (PPR) materials. For example, NPR materials can facilitate improved heat dissipation from, and/or cooling of, integrated components of LED bulbs. In some implementations, the NPR materials can allow the LED bulb components to be lighter than PPR-only LED bulbs. In some implementations, the NPR materials can provide improved mechanical and/or thermal stability based on comparative mechanical and/or thermal responses of the NPR materials and PPR portions of the LED bulbs.

Some aspects of this disclosure describe a light emitting diode (LED) bulb, comprising a bulb body, with one or more LEDs housed within the bulb body. One or more LED chip encapsulants encapsulate the one or more LEDs, wherein the one or more LED chip encapsulants are composed of a material having a negative Poisson's ratio.

This and other light emitting diodes (LEDs) described herein can have one or more of at least the following characteristics.

In some implementations, the LED chip encapsulants are formed of epoxy resin, polyurethane, acrylic, or silicone.

In some implementations, the LED chip encapsulants are formed of a transparent polymer foam NPR material.

In some implementations, this transparent polymer foam NPR material is composed of a cellular structure having a characteristic dimension of between 0.1 μm and 3 μm.

In some implementations, the LED chip encapsulants form a substantially circular and convex shape, configured to cover the one or more LEDs.

In some implementations, the LED chip encapsulants comprise an index of refraction between 1 and 2.5.

In another aspect, the light emitting diode (LED) bulb, comprises an LED driver circuit and a base electrically connected to the driver circuit. A heatsink is coupled to the base, wherein the heatsink is composed of a material having a negative Poisson's ratio.

In some implementations, this LED bulb comprises a thermal transfer pad thermally coupled to the base and heatsink.

In some implementations, the thermal transfer pad is composed of a material having a negative Poisson's ratio.

In some implementations, the heatsink is formed of a porous material.

In some implementations, the heatsink has one or more fans to dissipate heat.

In some implementations, the heatsink is formed of silicone, graphite, aluminum, or copper.

In some implementations, the heatsink and thermal transfer pad are formed of a common material.

In another aspect, the light emitting diode (LED) bulb, comprises a bulb body and an LED driver circuit. Thermal pottants encapsulate the LED driver circuit, wherein the thermal pottants are composed of a material having a negative Poisson's ratio.

In some implementations, the thermal pottants are formed of epoxy resin, polyurethane, acrylic, ceramic, glass-ceramic or silicone.

In some implementations, the LED driver circuit is composed of materials having a positive or negative Poisson's ratio.

In some implementations, some or all parts of the LED driver circuit are coated with the thermal pottants through an AM process.

In some implementations, the LED driver circuit is formed separately from the thermal pottants through an AM or heat/pressure process.

In some implementations, the aforementioned LED bulb comprises a heatsink.

In some implementations, the LED bulb further comprises a metal rod extending from the LED driver circuit, through the thermal pottants, and to the metal heatsink.

In some implementations, the metal heatsink is thermally coupled to the metal rod.

In some implementations, the heatsink is formed of a porous material.

Other features and advantages will be apparent from the description and the claims.

DESCRIPTION OF DRAWINGS

Figure 1A:
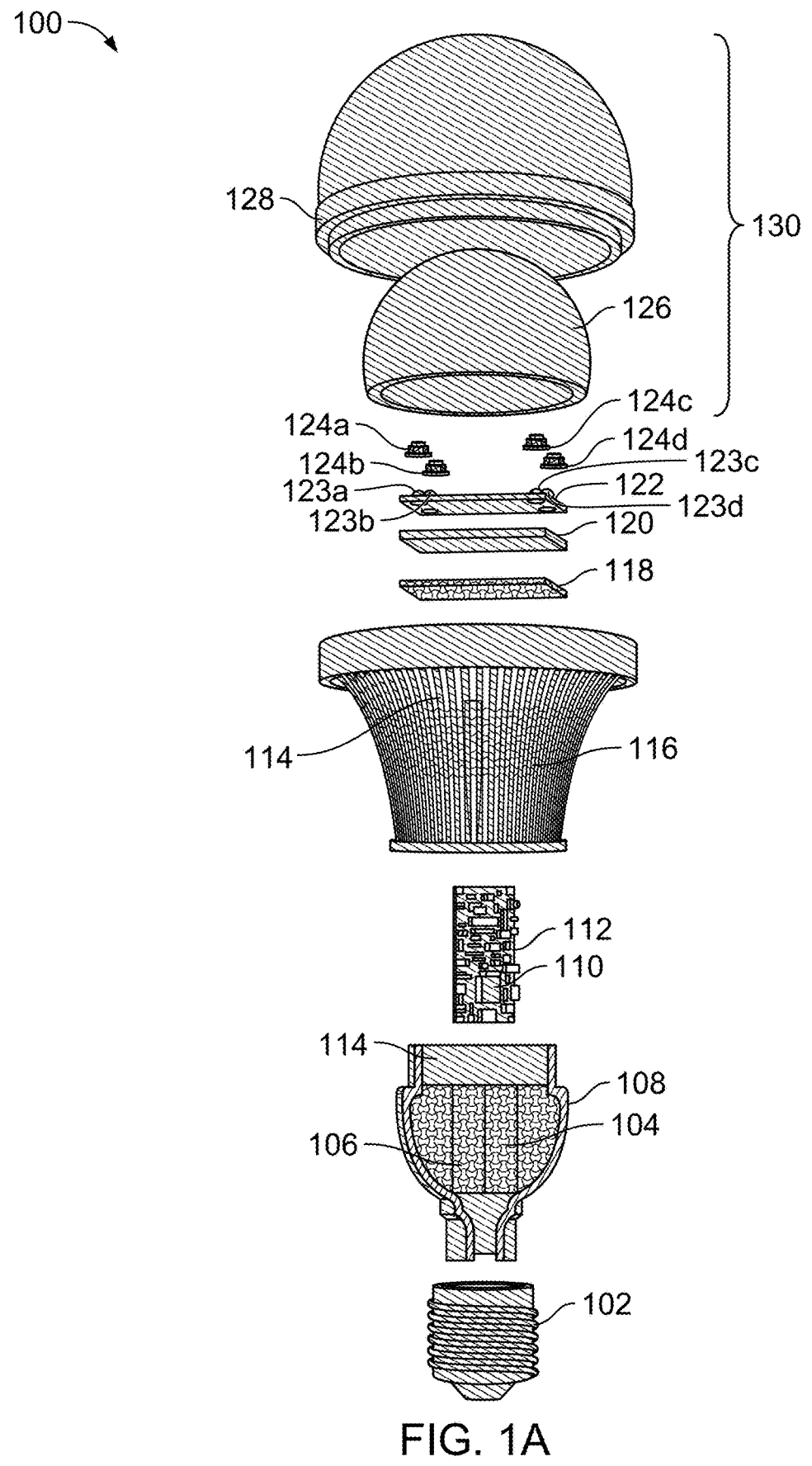

FIG. 1A is a diagram illustrating an example of an LED bulb incorporating components composed of an NPR material.

DETAILED DESCRIPTION

Figure 1B:
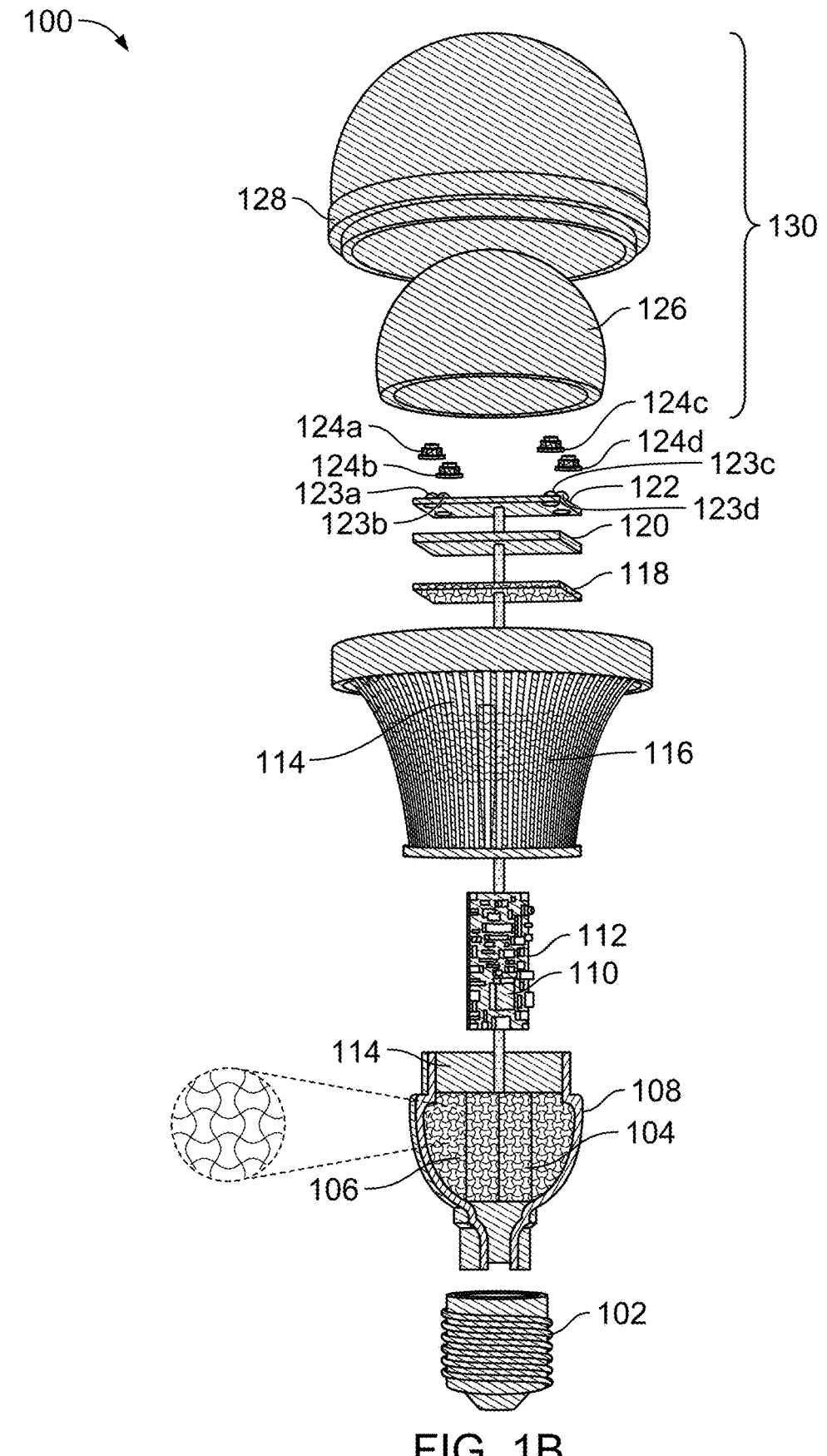
FIG. 1B is a diagram illustrating an example of an LED bulb incorporating components composed of an NPR material, with a metal rod connecting various components.

This disclosure describes LED bulbs that include materials having negative Poisson's ratios ("NPR materials"), sometimes referred to as auxetic materials. In some implementations, an LED bulb includes some components composed of a material having a negative Poisson's ratio, while other components are composed of a material having a positive Poisson's ratio (formed of a "PPR material").

Referring to FIG. 1, an example of an LED bulb 100 includes a first set of components (104, 106, 116, 118, 124*a*-*d*) composed of an NPR material, and a second set of components (102, 108, 110, 112, 114, 120, 122, 123*a*-*d*, 126, 128) composed of a PPR material. As depicted, the LED has a bulb body 130, wherein the bulb body 130 includes bulb-shaped primary optics 126, and secondary optics 128. The following bulb components include an NPR material (e.g., are composed entirely of an NPR material or are composed of an NPR-PPR composite material): thermal encapsulants 104, thermal pottants 106, heat sink 116, thermal interface materials 118, and LED chip encapsulants 124*a*-*d*. The following components are composed of a PPR material: a socket 102, a base 108, an LED driver 110, conformal coating 112, adhesives 114, reflector materials 120, an LED module 122, LEDs 123*a*-*d*, primary optics 126, and secondary optics 128. The function of the second set of PPR-integrated LED components is described in further detail below.

The socket 102 and base 108 may have standard dimensions sized to connect the LED bulb to a light fixture. The base 108 covers internal LED components such as the thermal encapsulants 104, thermal pottants 106, or various LED circuitry. The LED bulb also employs adhesives 114 to affix various LED components to one-another. The adhesives 114 may be used to fill space between various components, or as an environmental seal to protect interior LED bulb components from the environment. The adhesives 114 may be composed of epoxy resin, silicone rubber adhesive, or hotmelt adhesive, among other possible materials. In some implementations, the adhesives 114 are transparent.

The LED bulb 100 includes a variety of LED circuit components composed of PPR materials, such as an LED driver 110, LEDs 123*a*-*d*, conformal coating 112, and an LED module 122. The LED driver or driver circuit 110 may control the electrical current in the LED by converting it from AC to DC or by stepping it down to a voltage level that avoids damaging the LED circuit components. The LED driver may be electrically coupled to the LEDs 123-*d* and/or the LED module 122. In some implementations, the LED circuitry may include a capacitor to store energy, reduce power supply ripple from the LED driver, or temporarily illuminate the LED bulbs using the stored energy. The conformal coating 112 covers various LED circuit components. The conformal coating 112 helps isolate various circuit components from one another, protect circuit components from the environment, prevent contamination, and extend the lifetime of the LED bulb.

The LED module 122 includes LED's 123*a*-*d* mounted within the LED module 122, although in some embodiments the LED module 122 may include only a single LED. The LED module 122 and LEDs 123*a*-*d* are housed within the bulb body 130. The LEDs 123*a*-*d* emit light. Other components, including the reflector materials 120 and the bulb body 130, direct the emitted light from LEDs 123*a*-*d* outwards from the bulb. The LED module 122 may employ a Chip on Board (COB) LED structure, wherein several LED chips or LEDs 123*a*-*d* may be mounted onto a common substrate in the LED module 122. In some embodiments, the LED module 122 may include a substrate, e.g., made of ceramic, metal, or another suitable material, which allows the multiple LEDs 123*a*-*d* to be packaged together. In other implementations, the LEDs 123*a*-*d* may be mounted separately onto the LED module 122. The LED's 123*a*-*d* generate light, and they may be made of LED chips and/or semiconductors. While four LEDs (123*a*-*d*) are depicted, it should be understood that the LED module 122 can incorporate any number of LED's. Furthermore, while the LED circuit components, such as the LED driver 110, conformal coating 112, LEDs 123*a*-*d*, LED module 122 (among other circuit components) are described as being composed of a PPR material, they may be composed of an NPR material. As described in application Ser. No. 18/309,408, the contents of which are incorporated here by reference in their entirety, circuit chips may feature negative Poisson's ratio ("NPR") materials. The incorporation of NPR materials can provide various advantages over circuit chips that include only positive Poisson's ratio (PPR) materials. For example, in some implementations, NPR materials can facilitate improved heat dissipation from, and/or cooling of, integrated circuit(s) of the circuit chips. In some implementations, the NPR materials can allow the circuit chips to be lighter than PPR-only circuit chips. In some implementations, the NPR materials can provide improved mechanical and/or thermal stability based on comparative mechanical and/or thermal responses of the NPR materials and PPR portions of the circuit chips.

The LED module 122 interfaces with reflector materials 120 to reflect and direct emitted light toward the primary 126 and secondary 128 optics of the bulb. The reflector materials 120 can be made of a variety of reflective materials, such as polycarbonate with a metallized material, polymeric materials, or a variety of plastics or metals, among other materials. The reflector materials 120 interface with thermal interface materials 118, wherein the thermal interface materials 118 help dissipate heat waste generated from LEDs 123*a*-*d*.

The bulb body 130 directs the LED light out of the bulb. As stated above, the bulb body 130 includes primary optics 126 and secondary optics 128, which diffuse the light emitted from the LED chips across the space the bulb is used in. Typically, an LED primary optic emits light that spans an angle of between 120° and 180°. While this may be suitable in some applications, in other instances this light from the LED primary optics 126 may be spread over too broad an area and can lack intensity over a distance. To channel the LED light into a focused beam and alter the emission radius, some LEDs (e.g., as illustrated) employ secondary optics 128, such as a TIR lens that fits over the dome top of the LED bulb. This lens acts as a lens and reflector, and distributes and reflects the light rays outward. Once such secondary optics are implemented, the light can be emitted at an angle spanning up to 360° from the bulb.

The primary optics 126 and secondary optics 128 can be made of a durable plastic PPR material, such as Polyethylene Terephthalate (PET), High-Density Polyethylene (HDPE), Polyvinyl Chloride (PVC), Low Density Polyethylene (LDPE), or another material. In some implementations, the primary 126 and secondary 128 optics are made of epoxy resin or glass. In some implementations, the primary 126 and secondary 128 optics are shatter resistant. In some implementations, the primary 126 and secondary 128 optics allow a broad range of wavelengths, e.g., at least all visible wavelengths, to pass through them. In other implementations, the primary 126 and secondary 128 optics can be tinted or designed to allow one or a select few ranges of wavelengths to pass through.

As described here for the bulb of FIG. 1, the bulb body 130, primary optics 126, and secondary optics 128 are composed of a PPR material, but they may be integrated with an NPR material in some embodiments. In one example embodiment, the primary and secondary optic LED components are streamlined into one component by using an NPR coating. For instance, rather than fitting a secondary optic bulb body over the primary optic cover as shown in FIG. 1, an NPR-integrated bulb body employs an NPR coating inside the bulb to diffuse light across the space the LED is used in. This embodiment is depicted in the composite bulb cover 200 of FIG. 2, which shows a bulb body 202 lined with an interior coating 204 composed of a material having a negative Poisson's ratio. While the coating 204 is depicted lining the inside of the bulb body 202, it should be understood that the coating 204 can be integrated with the bulb body in a variety of ways. For example, the coating 204 may line the outside of the bulb, it may be made of an NPR-PPR composite material, or it may line the inside and/or outside of the bulb in patches of NPR, or NPR-PPR composite material. As depicted, the bulb body 202 extends to an outside point 128, and the coating 204 may extend to a depth 126, such that the coating 204 lines the inside of the bulb body 202. In some implementations, the coating 204 may fill the bulb body 202 entirely.

The bulb body 202 interfaces with the LED module 122 and houses four LEDs 123*a-d*. The bulb body 202, the LED module 122, and the LEDs 123*a-d* may be composed of a PPR material. In some implementations, each LED 123*a-d* may be housed by a corresponding LED chip encapsulant 124*a-d*. In some implementations, the LED chip encapsulants 124*a-d* are composed of an NPR material. It should be understood that there may be more or fewer encapsulants and LEDs. Dotted lines represent light emitted from the LEDs 123*a-d*, and the light may be dispersed by the coating 204 at a range of angles. This dispersion is represented by the change in the light angle as it enters the coating 204 and exits the bulb body 202. In some implementations, the coating 204 disperses light at 360° from the bulb body 202. In other implementations, the light is dispersed at a smaller angle. In some embodiments, the coating 204 can be tuned to disperse light at a set angle or angle range. In other implementations, the coating 204 can be configured to disperse specific wavelengths or color ranges of light. The coating 204 may be transparent or porous to facilitate the diffusion of light, or it may be tinted to disperse desired wavelengths of light.

Figure 2:
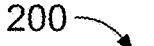
FIG. 2 is a diagram illustrating an example of a composite LED bulb cover, which incorporates a diffuser coating composed of an NPR material.
Figure 2:
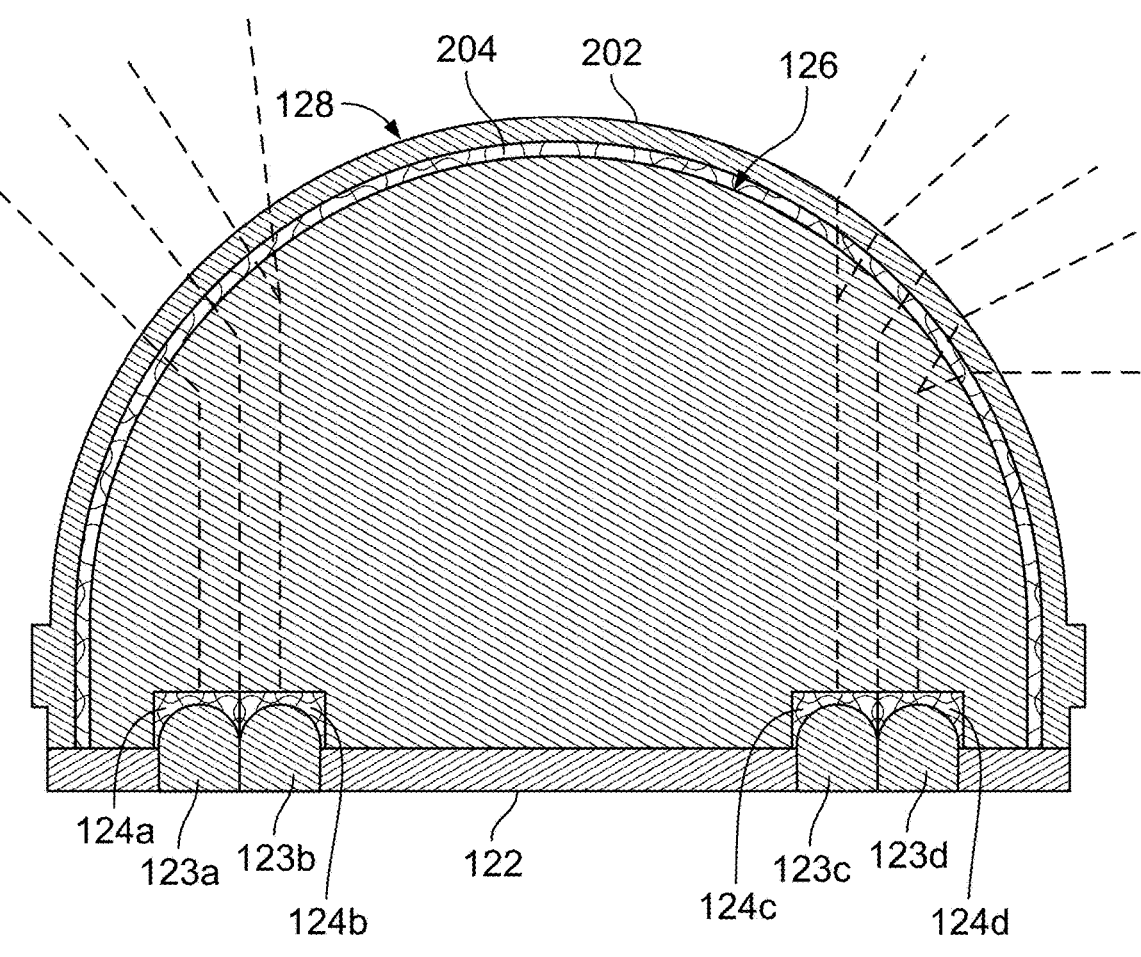

While the second set of LED components, including a socket 102, base 108, an LED driver 110, conformal coating 112, adhesives 114, reflector materials 120, LED module 122, primary optics 126, and secondary optics 128 are described as composed of an PPR material, it should be understood that any combination of these components can be either composed of an NPR material or made of an NPR-PPR material composite. As shown in FIG. 2, NPR materials can also be used to combine various components.

As stated above, NPR materials can exhibit various desirable properties, including high shear modulus, effective energy absorption, and high toughness (e.g., high resistance to indentation, high fracture toughness), among others. Furthermore, NPR materials are highly tunable, as their design and material can facilitate strong insulative properties, larger surface areas, and maximized heat dissipation. These properties may improve LED bulb designs, as the integration of NPR materials into LED's may make LED components more durable. NPR materials may further provide increased protection for circuit components through insulation and heat dissipation. The function of each LED component composed of a material having a negative Poisson's ratio is described in further detail below.

The thermal encapsulants 104 and thermal pottants 106 may cover various LED circuitry and fill space between LED circuit components and the LED base 108. These thermal encapsulants 104 and pottants 106 are housed within the LED base 108, and they may interface with the LED socket 102. The thermal encapsulants 104 and thermal pottants 106 may be made of a variety of materials. For example, they may be made of a hardened thermoset plastic like epoxy, urethane, or silicone, among other materials, wherein these materials may be composed of an NPR material. Such materials integrated with NPR materials may offer a higher voltage insulation, lower heat loss, and minimal shrinkage compared to existing thermal encapsulant and pottant materials.

The heat sink 116 helps dissipate and transfer heat away from circuit components. It is coupled with the thermal interface materials 118 and the LED base 108. The heat sink 116 may be made of a variety of materials such as aluminum, copper, or ceramic, among other materials, and it may be composed of an NPR material. The heat sink 116 may include one or more ridges or fins to increase its surface area and dissipate heat efficiently. In some implementations, the heat sink may be composed of a porous NPR material to further increase surface area and improve heat dissipation. The auxetic nature of the heat sink can provide the LED bulb 100 with one or more beneficial characteristics. For example, the porous nature of the heat sink can promote efficient cooling of/heat dissipation from the second set of LED components (102, 108, 110, 112, 114, 120, 122, 123, 126, 128), e.g., to dissipate heat generated by operation of the LED circuit components 110, 112, 122, 123*a-d*.

The heat sink 116 can have a high surface area-to-volume ratio, e.g., compared to a body having the same chemical composition as the heat sink 116 but lacking the microstructure that provides the heat sink 116 with its negative Poisson's ratio. The high surface area-to-volume ratio facilitates rapid heat diffusion from the heat sink 116 to the surrounding medium, such as air. Accordingly, heat generated by the LED circuit components can transfer to the heat sink 116 and be efficiently dissipated by the heat sink 116 based on the porous nature of the heat sink 116. The heat sink 116 and the LED circuit components (110, 112, 122, 123*a-d*), or thermal interface materials 118 can be thermally coupled to one another to facilitate the heat transfer, e.g., based on direct contact at the heat sink 116 and/or through one or more intervening layers.

Moreover, in some implementations, the pores of the heat sink 116 define channels through some or all of the heat sink 116. The medium in which the heat sink 116 is placed, such as air, can flow through the channels, providing more rapid heat dissipation than if the medium were static. In some implementations, the flow is unpowered and natural, e.g., resulting from variations in temperature throughout the medium. In other implementations, a fan is configured to cause airflow through the channels of the heat sink 116, to facilitate cooling. While these benefits of a porous NPR material are described for the heat sink 116, it should be understood that these benefits may apply to other LED components incorporating a porous or composite NPR material.

Turning to FIG. 1B, some embodiments of the system 100 may include one or more metal bodies, such as a metal pillar 132, extending from the LED driver 110 and/or conformal coating 112, through the thermal encapsulants 104 and thermal pottants 106, to the heat sink 116 to transfer heat from the PPR circuit components to the heat sink 116. In some embodiments, a metal pillar 134 may be extended from other LED circuit components (such as the LED module 122 and/or the LEDs 123*a-d*) to the thermal interface materials 118 or the heat sink 116. In other embodiments, the pillars 132 and 134 are connected, or only one of the pillars are included in the system 100. The metal bodies 132 and 134 can have high thermal conductivity to transfer heat through the first set of LED components and promote thermal dissipation/cooling. The metal bodies 132 and 134 can be provided in various orientations. In some implementations, the metal bodies include metal pillars that extend vertically, e.g., in the same stacking direction as the LED components. The metal bodies can be formed of one or more metals, e.g., copper, aluminum, titanium, a noble metal, and/or another metal.

The thermal interface materials 118 are positioned between the heat sink 116 and the reflector materials 120 to improve thermal transfer. The reflector materials 120 are interfaced with the LED module 122, and the LED module 122 is interfaced with one or more LEDs 123*a-d*. The one or more LEDs 123*a-d* electronically interfaced with the LED module 122 produce light, and the reflector materials 120 reflect the light towards the bulb body 130. The LEDs also produce heat waste, which is directed towards the thermal interface materials 118. Through direct contact with the heat sink 116, the thermal interface materials may help transfer heat from the LED's 123*a-d* or other LED circuit components to the heat sink 116, which then further dissipates the heat waste. The thermal interface materials 118 may be made of a variety of materials such as silicone, graphite, aluminum, or copper, wherein the thermal interface materials 118 may be composed of an NPR material. The thermal interface materials may also include various components to fill space between the LED and the heat sink. For example, the thermal interface materials 118 may employ a thermal transfer pad to transfer heat emitted from the LED's 123*a-d* or the LED circuit components to the heatsink, which may facilitate improved heat transfer and dissipation. In some implementations, the thermal interface materials 118 may be composed of an NPR-PPR composite material, or a porous NPR material to dissipate or transfer heat more efficiently.

Each LED chip encapsulant 124*a-d* is configured to encapsulate the one or more LEDs 123*a-d*, wherein the one or more LED chip encapsulants 124*a-d* are composed of an NPR material. The auxetic nature of the LED chip encapsulants may provide a protective barrier that helps extend the lifespan of LED or circuit components. The LED chip encapsulants 124*a-d* may also provide increased protection from the outside environment while improving heat dissipation and thermal management. The LED chip encapsulants 124*a-d* may be composed of a variety of NPR materials, and they may be transparent to allow light from the LEDs 123*a-d* to pass through. In some implementations, the LED chip encapsulants 124*a-d* may diffuse and focus light into bulb body to maximize LED light output. In other implementations, the LED chip encapsulants 124*a-d* may be tinted or may only allow a desired wavelength range to pass through. In other implementations, the LED chip encapsulants 124*a-d* may form a substantially circular and convex shape, configured to cover the one or more LEDs. In some embodiments, the LED chip encapsulants 124*a-d* may employ an interior coating material composed of an NPR material, wherein the interior coating helps disperse the light emitted from the one or more LEDs 123*a-d*.

In some implementations, the LED chip encapsulants 124*a-d* or the composite bulb cover 200 can be formed from a transparent material, e.g., a transparent polymer material, having a negative Poisson's ratio (NPR) with an index of refraction. The index of refraction may range between 1 and 2.5, but it should be understood that this range may be larger or smaller than disclosed. The material used to form these components can be transparent and may include acrylics, polyurethane, silicone, polycarbonate, epoxy resin, or combinations thereof. Acrylic materials can be rigid (e.g., PMMA) or flexible. These materials may be composed of an NPR material, or an NPR-PPR composite material. The materials can be formed of a material having a negative Poisson's ratio (NPR), e.g., an NPR foam material, such as an NPR polymer foam material or an NPR polymer sponge material. The materials may also be composed of a PPR material. While four encapsulants 124*a-d* are depicted encapsulating four LED's 123*a-d*, it should be understood that there may be more or fewer encapsulants and LED's. It should also be understood that, while the transparent polymer materials are described in detail for LED chip encapsulants 124*a-d*, these transparent polymer materials may be integrated into any number of the described LED components.

A variety of LED components have been described above, employing either NPR or PPR materials. It should be understood that any combination of the LED components may be composed of an NPR, PPR, NPR-PPR composite, or NPR foam material.

Figure 3:
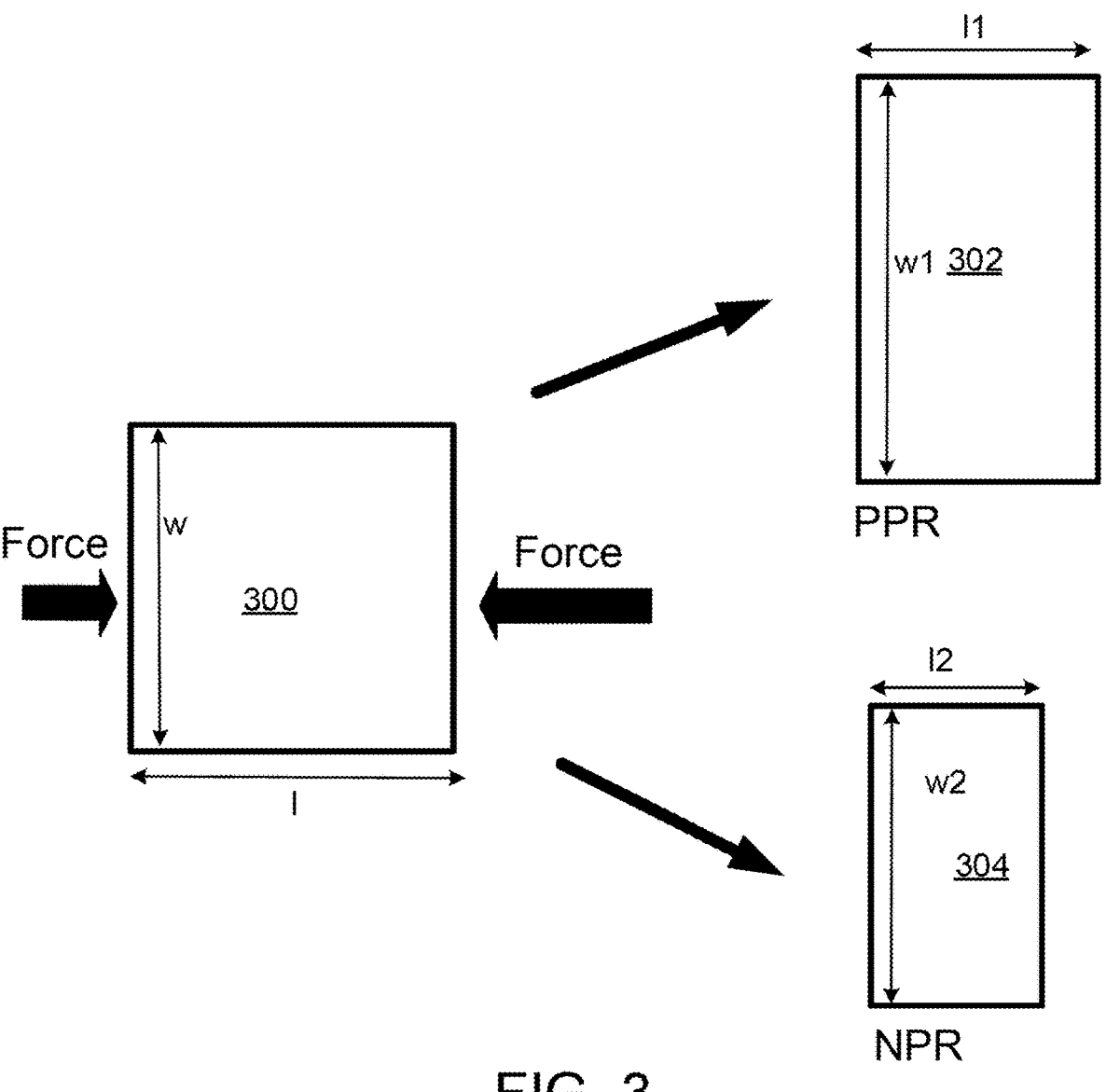
FIG. 3 is an illustration of materials with negative and positive Poisson's ratios.

Materials with negative and positive Poisson's ratios are illustrated in FIG. 3, which depicts a hypothetical two-dimensional block of material 300 with length 1 and width w.

If the hypothetical block of material 300 is a PPR material, when the block of material 300 is compressed along its width w, the material deforms into the shape shown as block 302. The width w1 of block 302 is less than the width w of block 300, and the length 11 of block 302 is greater than the length 1 of block 300: the material compresses along its width and expands along its length.

By contrast, if the hypothetical block of material 300 is an NPR material, when the block of material 300 is compressed along its width w, the material deforms into the shape shown as block 304. Both the width w2 and the length 12 of block 304 are less than the width w and length 1, respectively, of block 300: the material compresses along both its width and its length.

Figure 4:
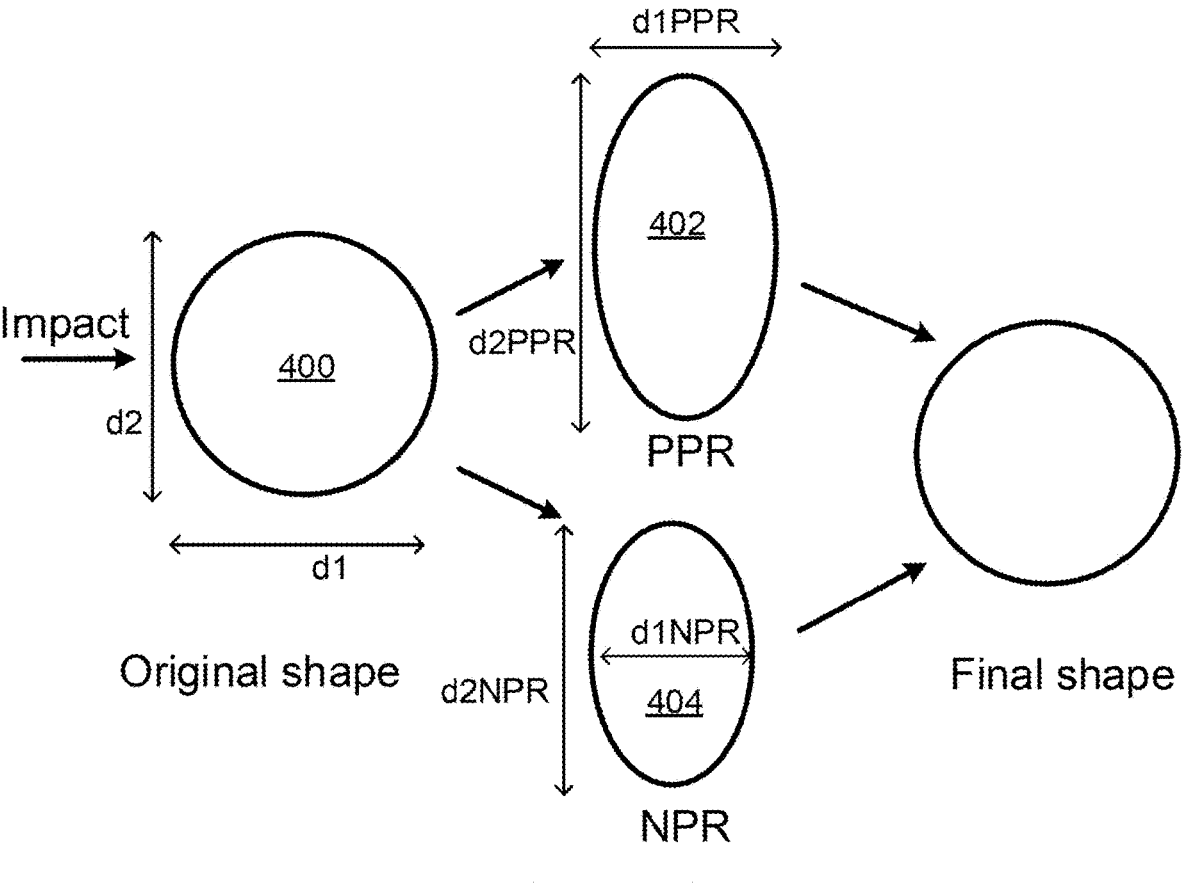
FIG. 4 is an illustration of balls with negative and positive Poisson's ratios.

FIG. 4 shows a schematic depiction of the change in diameter of a material 400 upon impact. Although the material 400 in FIG. 4 is shown as a rounded ball, a similar deformation occurs in materials of other shapes. Prior to impact, the material 400 has a diameter d1 in the direction of the impact and a diameter d2 in the direction perpendicular to the impact. If the material 400 is a PPR material, the material undergoes significant deformation (e.g., elastic deformation) into a shape 402, such that the diameter in the direction of the impact decreases to d1PPR and the diameter in the direction perpendicular to the impact increases to d2PPR. By contrast, if the material 400 is an NPR material, the material undergoes less extensive deformation into a shape 404. The diameter of the shape 404 in the direction of the impact decreases to d1NPR, which is approximately the same as d1PPR. However, the diameter of the shape 404 in the direction perpendicular to the impact also decrease, to d2NPR. The magnitude of the difference between d2 and d2NPR is less than the magnitude of the difference between d2 and d2PPR, meaning that the NPR material undergoes less deformation than the PPR ball. This reduction in total deformation that is achievable by an NPR material enables the NPR material to have a different (e.g., longer) launching distance than an otherwise comparable PPR material at least in part because the NPR material has a lower wind resistance due to its smaller diameter upon compression.

Figure 5A:
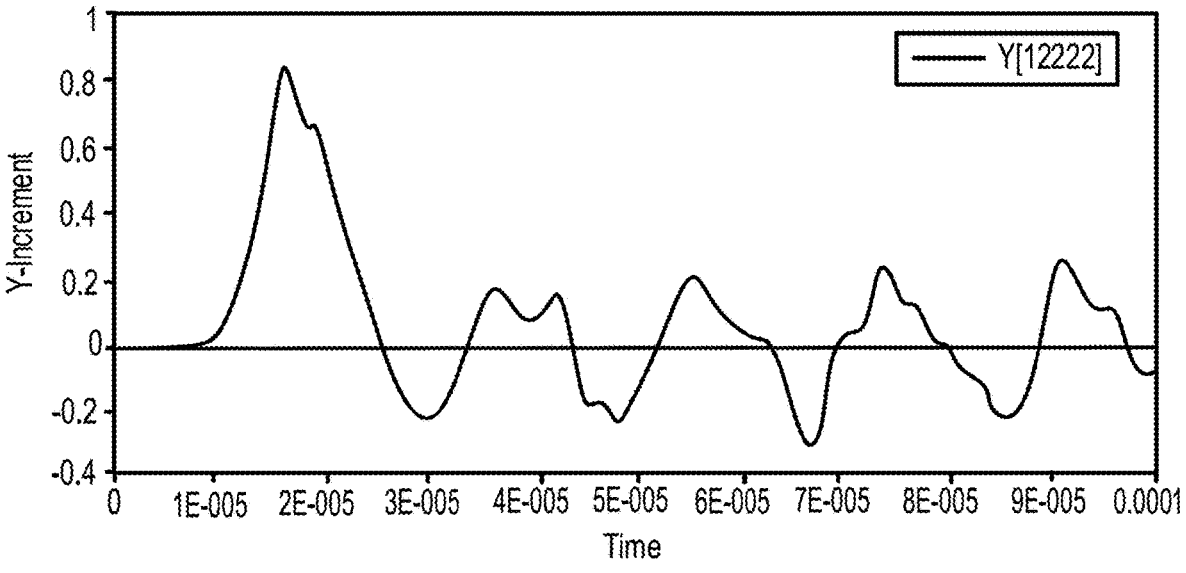
FIGS. 5A and 5B are plots of diameter versus time.
Figure 5B:
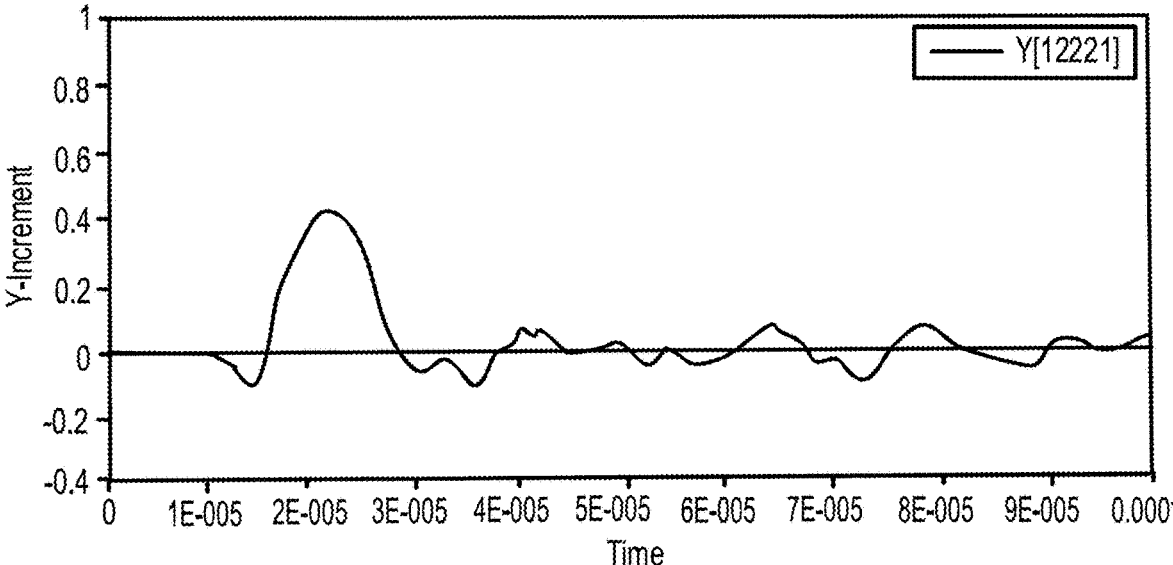

FIGS. 5A and 5B show plots of diameter versus time for a substantially spherical PPR material with a Poisson's ratio of 0.45 and an NPR material with a Poisson's ratio of −0.45, respectively, responsive to being struck with an equivalent force. In this example, the NPR material undergoes a smaller initial change in diameter than does the PPR material, and the oscillations in diameter are smaller in magnitude and dampen more quickly. Again, although FIGS. 5A and 5B are specific to substantially spherical materials, a similar behavior occurs in NPR and PPR materials of other shapes.

In some implementations, this reduced deformation demonstrated by NPR materials in FIGS. 4-5 may contribute to the development of shatter-proof LED components. In some embodiments, any combination of the primary optics 126, secondary optics 128, LED chip encapsulants 124a-d, the socket 102, and the base 108 may be comprised of an NPR material, wherein the NPR material may be shatter-proof. Overall, the minimized deformation of NPR materials compared to PPR materials during compression may enhance the longevity of LED components, as they may become less prone to deformation or breakage.

As stated above, one or more LED bulb components may be made of an NPR-PPR composite material. NPR-PPR composite materials are composites that include both regions of NPR material and regions of PPR material. NPR-PPR composite materials can be laminar composites, matrix composites (e.g., metal matrix composites, polymer matrix composites, or ceramic matrix composites), particulate reinforced composites, fiber reinforced composites, or other types of composite materials. In some examples, the NPR material is the matrix phase of the composite and the PPR material is the reinforcement phase, e.g., the particulate phase or fiber phase. In some examples, the PPR material is the matrix phase of the composite, and the NPR material is the reinforcement phase. In some examples, the PPR material is the matrix phase of the composite and the NPR material is the reinforcement phase. NPR-PPR composite materials can form the porous structures and foam structures described in any of the implementations described herein. For example, in some implementations, the first set of LED components are formed from an NPR-PPR composite material.

Figure 6:
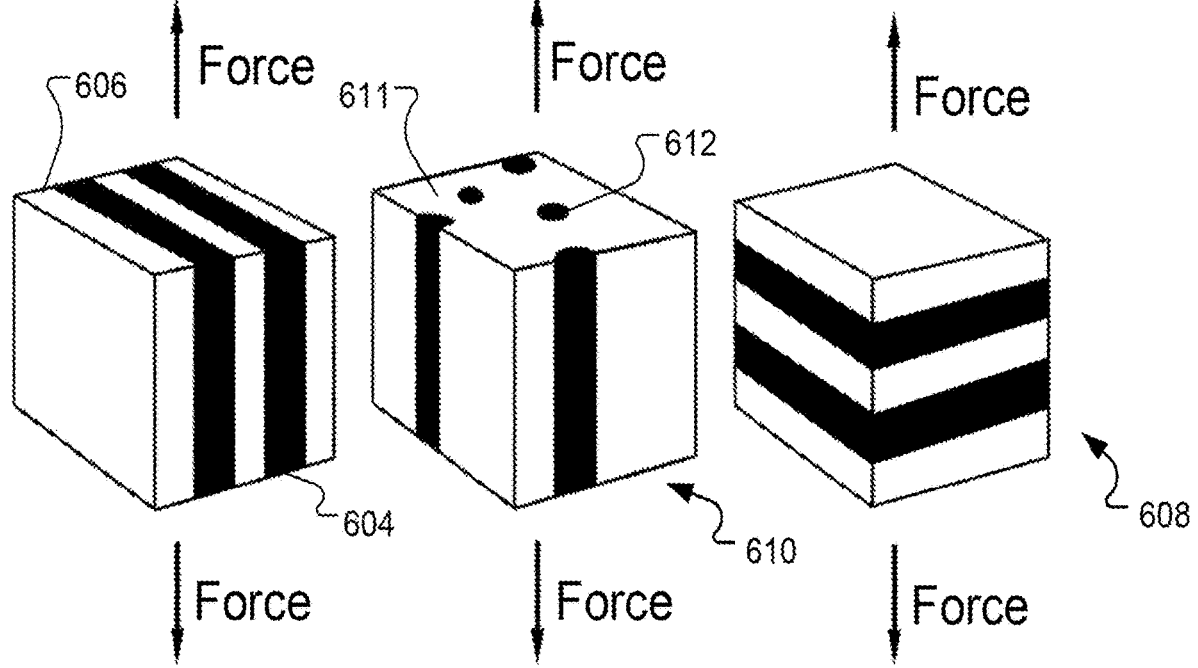
FIG. 6 is an illustration of composite materials.

FIG. 6 illustrates examples of NPR-PPR composite materials. An NPR-PPR composite material 602 is a laminar composite including alternating layers 604 of NPR material and layers 606 of PPR material. The layers 604, 606 are arranged in parallel to a force to be exerted on the composite material 602. Although the layers 604, 606 are shown as having equal width, in some examples, a laminar composite can have layers of different widths.

Figure 7:
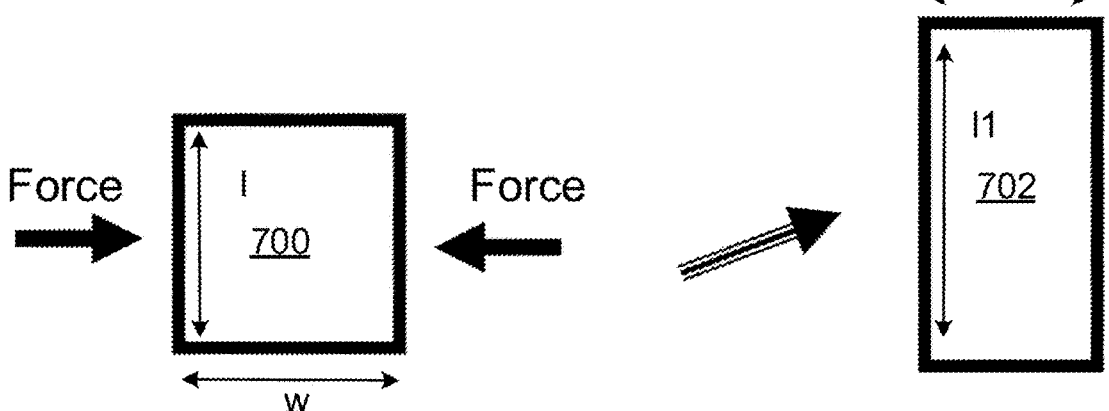
FIG. 7 is an illustration of a material with a positive Poisson's ratio and a composite material.
Figure 7:
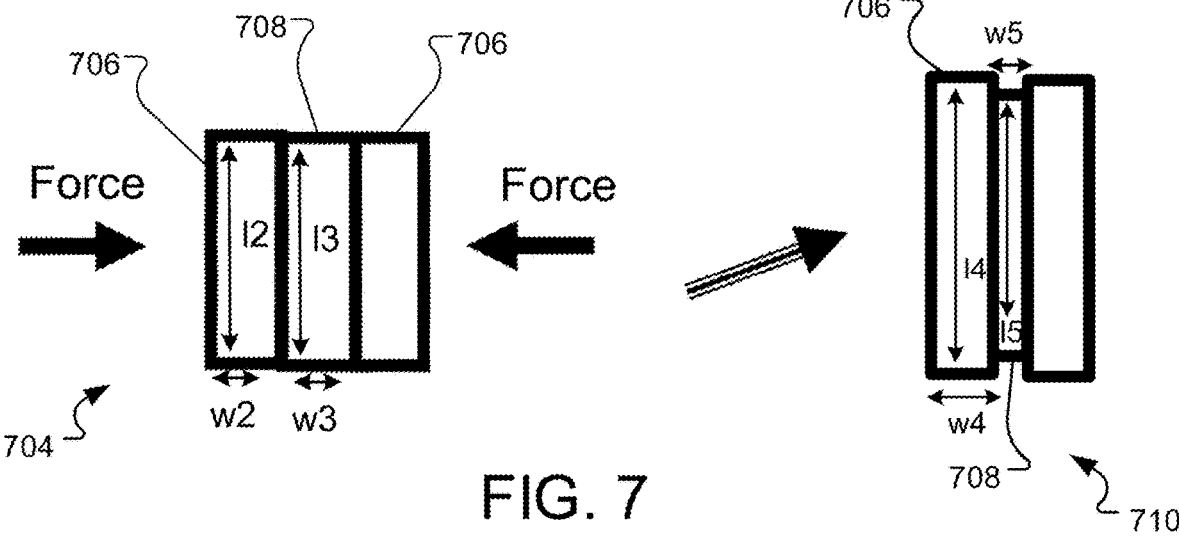

FIG. 7 illustrates the mechanical behavior of PPR and NPR/PPR composite materials. A hypothetical block 700 of PPR material, when compressed along its width w, deforms into a shape 702. The width w1 of the compressed block 702 is less than the width w of the uncompressed block 700, and the length 11 of the compressed block 702 is greater than the length 1 of the uncompressed block: the material compresses along the axis to which the compressive force is applied and expands along a perpendicular axis.

As stated above, various NPR materials in LED bulbs can be formed of foams, such as polymeric foams, ceramic foams, metal foams, or combinations thereof. A foam is a multi-phase composite material in which one phase is gaseous and the one or more other phases are solid (e.g., polymeric, ceramic, or metal). Foams can be closed-cell foams, in which each gaseous cell is sealed by solid material; open-cell foams, in which each cell communicates with the outside atmosphere; or mixed, in which some cells are closed and some cells are open.

An example of an NPR foam structure is a re-entrant structure, which is a foam in which the walls of the cells are concave, e.g., protruding inwards toward the interior of the cells. In a re-entrant foam, compression applied to opposing walls of a cell will cause the four other, inwardly directed walls of the cell to buckle inward further, causing the material in cross-section to compress, such that a compression occurs in all directions. Similarly, tension applied to opposing walls of a cell will cause the four inwardly directed walls of the cell to unfold, causing the material in cross-section to expand, such that expansion occurs in all directions. NPR foams can have a Poisson's ratio of between −1 and 0, e.g., between −0.8 and 0, e.g., −0.8, −0.7, −0.6, −0.5, −0.4, −0.3, −0.2, or −0.1. NPR foams can have an isotropic Poisson's ratio (e.g., Poisson's ratio is the same in all directions) or an anisotropic Poisson's ratio (e.g., Poisson's ratio when the foam is strained in one direction differs from Poisson's ratio when the foam is strained in a different direction).

An NPR foam can be polydisperse (e.g., the cells of the foam are not all of the same size) and disordered (e.g., the cells of the foam are randomly arranged, as opposed to being arranged in a regular lattice). An NPR foam can have a characteristic dimension (e.g., the size of a representative cell, such as the width of the cell from one wall to the opposing wall) ranging from 0.1 μm to about 3 mm, e.g., about 0.1 μm, about 0.5 μm, about 1 μm, about 10 μm, about 50 μm, about 100 μm, about 500 μm, about 1 mm, about 2 mm, or about 3 mm.

Examples of cell structures that can be realized on a macroscale or on a micro/nano scale in NPR bodies include stackings (e.g., ABAB or AAA stackings) of a quadratic chiral lattice, inverse honeycomb, double arrow, re-entrant hexagonal, re-entrant square, and other structures that can be identified by suitable computational and/or experimental methods. Example computational methods can be found in Korner and Liebold-Ribeiro, "A systematic approach to identify cellular auxetic materials," SmartMaterials and Structures 24(2) (2015).

Examples of auxetic semiconductor materials (e.g., in a porous/foam form) for use in NPR LED components include silicon, germanium, and silicon carbide.

Examples of auxetic polymeric structures (e.g., in a porous/foam form) for use in the NPR LED components include thermoplastic polymer foams (e.g., polyester polyurethane or polyether polyurethane); viscoelastic elastomer foams; and thermosetting polymer foams such as silicone rubber. Some polymer foams may be transparent, and they may include an index of refraction to disperse incoming light.

Examples of auxetic glasses and/or ceramics (e.g., in a porous/foam form) for use in the NPR LED components include metal oxides (e.g., aluminum oxide, titanium oxide, or zirconium oxide), other oxides (e.g., silicon oxide, such as SiO2, or aluminum borosilicate), carbon, and hydroxy-apatite.

Examples of auxetic semiconductor materials (e.g., in a porous/foam form) for use in the first body 102 include silicon, germanium, and silicon carbide.

Examples of auxetic glass-ceramics (e.g., in a porous/foam form) for use in the NPR LED components include ZnO—Al2O3-SiO2, in some cases having one or more oxides (e.g., CaO, BaO and/or B2O3), the inclusion of which can alter thermal properties of the of the glass-ceramic. As another example, silicon oxycarbide glass-ceramics can be formed with an auxetic structure.

In some examples, NPR foams are produced by transformation of PPR foams to change the structure of the foam into a structure that exhibits a negative Poisson's ratio. In some examples, NPR foams are produced by transformation of nanostructured or microstructured PPR materials, such as nanospheres, microspheres, nanotubes, microtubes, or other nano- or micro-structured materials, into a foam structure that exhibits a negative Poisson's ratio. The transformation of a PPR foam or a nanostructured or microstructured material into an NPR foam can involve thermal treatment (e.g., heating, cooling, or both), application of pressure, or a combination thereof. In some examples, PPR materials, such as PPR foams or nanostructured or microstructured PPR materials, are transformed into NPR materials by chemical processes, e.g., by using glue. In some examples, NPR materials are fabricated using micromachining or lithographic techniques, e.g., by laser micromachining or lithographic patterning of thin layers of material. In some examples, NPR materials are fabricated by additive manu-facturing (e.g., three-dimensional (3D) printing) techniques, such as stereolithography, selective laser sintering, or other appropriate additive manufacturing technique.

In an example, a PPR thermoplastic foam, such as an elastomeric silicone film, can be transformed into an NPR foam by compressing the PPR foam, heating the compressed foam to a temperature above its softening point, and cooling the compressed foam. Transformation processes can be done inside a predetermined dimension. In an example, a PPR foam composed of a ductile metal can be transformed into an NPR foam by uniaxially compressing the PPR foam until the foam yields, followed by uniaxially compression in other directions.

Figure 8:
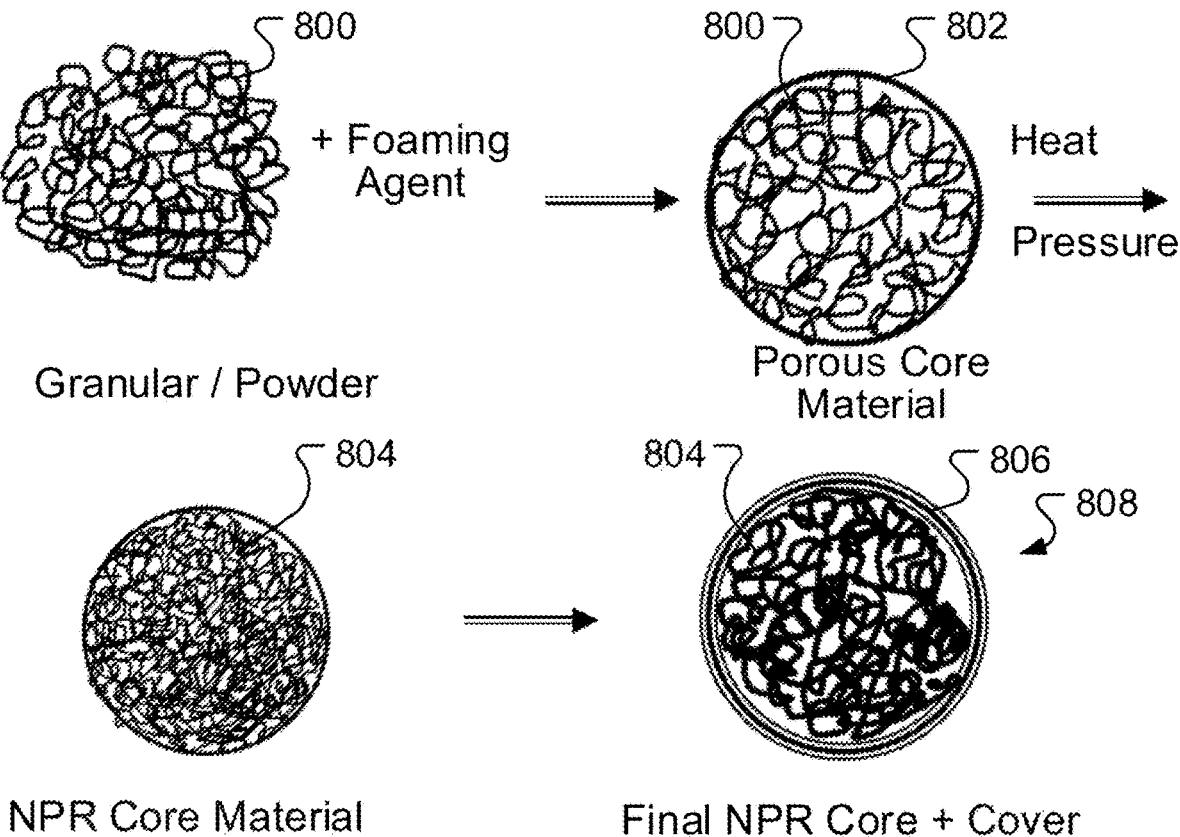
FIG. 8 is a diagram of a method of making an NPR material.

FIG. 8 illustrates an example method of making an object, such as an LED chip encapsulant, formed of an NPR material. A granular or powdered material, such as a poly-mer material (e.g., a rubber) is mixed with a foaming agent to form a porous material 800. The porous material 800 is placed into a mold 802. Pressure is applied to compress the material 800 and the compressed material is heated to a temperature above its softening point. The material is then allowed to cool, resulting in an NPR foam 804. The NPR foam 804 is covered with an outer layer 806, such as a polymer layer, and heat and pressure is applied again to cure the final material into an object 808.

NPR bodies, having a structure such as the porous struc-ture described above, can be produced in a variety of ways. In some implementations, an initially PPR material (some-times referred to as a "precursor material") is converted into the NPR material. For example, a porous PPR sponge or foam can be transformed to change its structure into a structure that exhibits a negative Poisson's ratio. In some examples, NPR foams are produced by transformation of nanostructured or microstructured PPR materials, such as nanospheres, microspheres, nanotubes, microtubes, or other nano- or micro-structured materials, into a foam structure that exhibits a negative Poisson's ratio. The transformation of a PPR foam or a nanostructured or microstructured material into an NPR foam can involve thermal treatment (e.g., heating, cooling, or both), application of pressure, or a combination thereof. In some examples, PPR materials, such as PPR foams or nanostructured or microstructured PPR materials, are transformed into NPR materials by chemical processes, e.g., by using an adhesive. In some examples, NPR materials are fabricated using micromachin-ing or lithographic techniques, e.g., by laser micromachining or lithographic patterning of thin layers of material. In some examples, NPR materials are fabricated by additive manu-facturing (e.g., three-dimensional (3D) printing) techniques, such as stereolithography, selective laser sintering, or other appropriate additive manufacturing techniques.

In an example of a process, a PPR thermoplastic foam, such as an elastomeric silicone film, can be transformed into an NPR foam by compressing the PPR foam, heating the compressed foam to a temperature above its softening point, and cooling the compressed foam.

In an example, a PPR foam composed of a ductile metal can be transformed into an NPR foam by uniaxially com-pressing the PPR foam until the foam yields, followed by uniaxial compression in other directions.

Other methods of making an NPR body, such as various additive manufacturing (AM) methods, are also within the scope of this disclosure. Examples of AM methods include powder bed binder-jetting and resin-based stereolithogra-phy/digital light projection-based processes. In the case of powder bed binder-jetting, a precursor material, such as a ceramic, glass, glass-ceramic, or semiconductor, is made into a fine powder consistency. A layer of the powder is provided into a powder bed. An adhesive/polymer binder is deposited selectively in a determined cross-sectional shape onto the powder to provide structure, e.g., using an inkjet printer. The structure provides auxeticity to the material, e.g., based on a porous cell structure. After each layer, a dispenser deposits a fresh powder layer. After completion of printing, the printed structure undergoes a debinding/curing process in which the binder is pyrolized/burnt out of the structure (e.g., at an elevated temperature), leaving an NPR material.

In the case of resin-based printing, the ceramic, glass, glass-ceramic, or semiconductor powder is mixed with a photocurable resin to produce a slurry. The slurry is pro-vided into a slurry bed, and a laser or other light source is used to selectively illuminate the slurry in a determined cross-sectional shape. For example, the laser can selectively scan across a surface of the slurry, or a light projector can illuminate the shape in a simultaneous flash. Photo-reactive compounds in the resin react with the light to locally cure the resin in the desired shape. The desired shape can be a porous structure that provides auxeticity. A wiper is swept across a surface of the slurry to provide a fresh coating, and the process repeats layer-by-layer. Post-processing can be per-formed to remove the resin.

As a further example, porous silicon, which in some implementations can be formed with a structure that pro-vides a negative Poisson's ratio, can be fabricated by anod-ization, by stain-etching, or by bottom-up synthesis.

In some implementations, NPR LED components may be formed on the PPR LED components. For example, the thermal encapsulants 104 or the thermal pottants 106 can be formed by a bottom-up AM method starting at the base 108. In some implementations, the base 108 can serve as a substrate on which the thermal encapsulants 104 or the thermal pottants 106 are additively manufactured.

In some implementations, instead of or in addition to heat dissipation benefits provided by the NPR-integrated LED components, or NPR-PPR composite LED components, LED components comprising NPR materials can have beneficial mechanical and/or thermal response properties. They can mechanically behave oppositely to one another in response to a given force/pressure, e.g., expand/contract in orthogonal directions to one another in response to a force in a given direction. In some implementations, NPR and PPR materials can mechanically respond oppositely to one another in response to a change in temperature. In some cases, this can result in the LED components as a whole being more mechanically robust.

Moreover, in some implementations, the first set of LED components, based on their auxetic structure, have a lower density than an alternative PPR body, such that the LED bulb 100 can be provided with reduced weight. For example, the first set of LED components can have a lower density than the second set of LED components. As computing devices are increasingly integrated into weight-critical applications such as space vehicles, mobile devices, and Internet of Things (IoT) devices, the reduced weight provided by the use of NPR materials can be beneficial.

Various modifications will be apparent from the foregoing detailed description. For example, features described above in connection with different implementations may, in some cases, be combined in the same implementation. In some instances, the order of the process steps may differ from that described in the particular examples above.

Accordingly, other implementations are also within the scope of the claims.

What is claimed is:

1. A light emitting diode (LED) bulb, comprising:
   a bulb body,
   one or more LEDs housed within the bulb body,
   one or more LED chip encapsulants encapsulating the one or more LEDs, wherein the one or more LED chip encapsulants include a material having a negative Poisson's ratio (NPR material), and the NPR material comprises a re-entrant structure.

2. The LED bulb of claim 1, in which the one or more LED chip encapsulants are formed of epoxy resin, polyurethane, acrylic, or silicone.

3. The LED bulb of claim 1, in which the one or more LED chip encapsulants are formed of a transparent polymer foam NPR material.

4. The LED bulb of claim 3, in which the transparent polymer foam NPR material is composed of a cellular structure having a characteristic dimension of between 0.1 μm and 3 mm.

5. The LED bulb of claim 1, in which the one or more LED chip encapsulants form a substantially circular and convex shape, configured to cover the one or more LEDs.

6. The LED bulb of claim 1, in which the one or more LED chip encapsulants comprise an index of refraction between 1 and 2.5.

\* \* \* \* \*